United States Patent
Yabuhara et al.

(10) Patent No.: US 9,142,774 B2
(45) Date of Patent: Sep. 22, 2015

(54) NONVOLATILE MEMORY DEVICE AND METHOD FOR MANUFACTURING THE SAME

(71) Applicants: Hidehiko Yabuhara, Kanagawa-ken (JP); Takashi Hirotani, Kanagawa-ken (JP); Junji Kataoka, Kanagawa-ken (JP); Hisashi Kameoka, Mie-ken (JP)

(72) Inventors: Hidehiko Yabuhara, Kanagawa-ken (JP); Takashi Hirotani, Kanagawa-ken (JP); Junji Kataoka, Kanagawa-ken (JP); Hisashi Kameoka, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/715,180

(22) Filed: Dec. 14, 2012

(65) Prior Publication Data

US 2013/0153850 A1 Jun. 20, 2013

(30) Foreign Application Priority Data

Dec. 20, 2011 (JP) ................................. 2011-278990

(51) Int. Cl.
*H01L 45/00* (2006.01)

(52) U.S. Cl.
CPC .......... *H01L 45/1608* (2013.01); *H01L 45/085* (2013.01); *H01L 45/12* (2013.01); *H01L 45/1233* (2013.01); *H01L 45/145* (2013.01); *H01L 45/148* (2013.01); *H01L 45/1675* (2013.01)

(58) Field of Classification Search
CPC .......................... H01L 45/085; H01L 45/1608
USPC ....................... 365/148, 180; 257/3, E45.003; 438/385, 382
See application file for complete search history.

(56) References Cited

U.S. PATENT DOCUMENTS

| | | | | |
|---|---|---|---|---|
| 8,829,482 | B1* | 9/2014 | Gallo et al. | 257/4 |
| 8,854,873 | B1* | 10/2014 | Hollmer et al. | 365/163 |
| 2006/0054950 | A1* | 3/2006 | Baek et al. | 257/295 |
| 2007/0252193 | A1* | 11/2007 | Cho et al. | 257/315 |
| 2008/0007988 | A1* | 1/2008 | Ahn et al. | 365/148 |
| 2008/0280415 | A1* | 11/2008 | Kajigaya | 438/382 |
| 2009/0014770 | A1* | 1/2009 | Terao et al. | 257/314 |
| 2009/0026434 | A1* | 1/2009 | Malhotra et al. | 257/2 |
| 2009/0272961 | A1* | 11/2009 | Miller et al. | 257/4 |
| 2009/0272962 | A1* | 11/2009 | Kumar et al. | 257/4 |
| 2010/0006813 | A1* | 1/2010 | Xi et al. | 257/4 |

(Continued)

FOREIGN PATENT DOCUMENTS

| | | |
|---|---|---|
| CN | 101034590 A | 9/2007 |
| CN | 102194512 A | 9/2011 |

(Continued)

OTHER PUBLICATIONS

Japanese Office Action issued Nov. 20, 2013, in Japan Patent Application No. 2011-278990 (with English translatlion).

(Continued)

*Primary Examiner* — Joseph C Nicely
(74) *Attorney, Agent, or Firm* — Oblon, McClelland, Maier & Neustadt, L.L.P.

(57) ABSTRACT

According to one embodiment, a nonvolatile memory device includes a first electrode, a second electrode, and a memory cell provided between the first electrode and the second electrode. The memory cell includes a retention unit, a resistance change unit, and an ion supply unit. The retention unit is provided on the first electrode and has an electron trap. The resistance change unit is provided on the retention unit. The ion supply unit is provided between the resistance change unit and the second electrode and includes a metal element.

20 Claims, 5 Drawing Sheets

(56) References Cited

U.S. PATENT DOCUMENTS

| | | | |
|---|---|---|---|
| 2010/0187595 A1* | 7/2010 | Lee et al. | 257/321 |
| 2010/0230655 A1* | 9/2010 | Noshiro | 257/5 |
| 2010/0240207 A1* | 9/2010 | Park et al. | 438/591 |
| 2010/0243983 A1* | 9/2010 | Chiang et al. | 257/4 |
| 2010/0265750 A1* | 10/2010 | Yan et al. | 365/51 |
| 2010/0288995 A1* | 11/2010 | Ozawa et al. | 257/4 |
| 2010/0327253 A1* | 12/2010 | Nakai et al. | 257/4 |
| 2011/0095259 A1* | 4/2011 | Lee | 257/4 |
| 2011/0108829 A1* | 5/2011 | Banno | 257/43 |
| 2011/0147825 A1* | 6/2011 | Park et al. | 257/324 |
| 2011/0194329 A1* | 8/2011 | Ohba et al. | 365/148 |
| 2011/0235419 A1* | 9/2011 | Ishimaru et al. | 365/185.15 |
| 2012/0015512 A1* | 1/2012 | Sung et al. | 438/591 |
| 2012/0068144 A1* | 3/2012 | Fujitsuka et al. | 257/4 |
| 2012/0068146 A1* | 3/2012 | Hattori et al. | 257/4 |
| 2012/0243293 A1* | 9/2012 | Takashima et al. | 365/148 |
| 2012/0294063 A1* | 11/2012 | Mizuguchi et al. | 365/148 |
| 2012/0314479 A1* | 12/2012 | Mizuguchi et al. | 365/148 |
| 2013/0001503 A1* | 1/2013 | Gallo | 257/4 |
| 2013/0051116 A1* | 2/2013 | En et al. | 365/148 |
| 2013/0051117 A1* | 2/2013 | En et al. | 365/148 |
| 2013/0065377 A1* | 3/2013 | Gopal et al. | 438/382 |
| 2013/0070515 A1* | 3/2013 | Mayhew et al. | 365/148 |
| 2013/0083048 A1* | 4/2013 | Weiss | 345/555 |
| 2013/0153845 A1* | 6/2013 | Wang et al. | 257/2 |
| 2013/0228735 A1* | 9/2013 | Higuchi et al. | 257/4 |
| 2013/0328009 A1* | 12/2013 | Miyagawa et al. | 257/4 |
| 2014/0063901 A1* | 3/2014 | Sunkavalli et al. | 365/148 |
| 2014/0070160 A1* | 3/2014 | Ishikawa et al. | 257/4 |

FOREIGN PATENT DOCUMENTS

| | | | | |
|---|---|---|---|---|
| JP | 2007165474 A | * | 6/2007 | H01L 27/10 |
| JP | 2008-22007 | | 1/2008 | |
| JP | 2008-42034 | | 2/2008 | |
| JP | 2011-187925 | | 9/2011 | |
| WO | WO 2010/117818 A2 | | 10/2010 | |

OTHER PUBLICATIONS

Combined Chinese Office Action and Search Report issued Feb. 3, 2015 in Patent Application No. 201210557218.8 (with English language translation).

* cited by examiner

NONVOLATILE MEMORY DEVICE AND METHOD FOR MANUFACTURING THE SAME

CROSS-REFERENCE TO RELATED APPLICATIONS

This application is based upon and claims the benefit of priority from the prior Japanese Patent Application No. 2011-278990, filed on Dec. 20, 2011; the entire contents of which are incorporated herein by reference.

FIELD

Embodiments described herein relate generally to a nonvolatile memory device and a method for manufacturing the same.

BACKGROUND

There is a nonvolatile memory device in which a resistance change unit and an ion supply unit are provided between two electrodes.

In such a nonvolatile memory device, when a voltage is applied using the electrode on the ion supply unit side as a positive pole and the electrode on the resistance change unit side as a negative pole, a metal included in the ion supply unit is ionized to diffuse into the resistance change unit and receives electrons from the electrode on the negative pole side. Thereby, a conduction path (filament) of a metal is formed between the two electrodes. This leads to a situation where the resistance between the electrode on the ion supply unit side and the electrode on the resistance change unit side is low.

On the other hand, when a voltage of the opposite polarity is applied, the metal forming the conduction path is ionized, and thereby the conduction path becomes short and furthermore disappears. This leads to a situation where the resistance between the electrode on the ion supply unit side and the electrode on the resistance change unit side is high.

Thus, at least two resistance states can be created, and data can therefore be stored.

However, in such a nonvolatile memory device, for example, there is a problem that the formed conduction path becomes short or something to change the resistance state even in a state where no voltage is applied.

Hence, it is desired to develop a nonvolatile memory device in which the properties that resistance states can be retained for a long time (data retention properties) are high.

DETAILED DESCRIPTION

Figure 1:
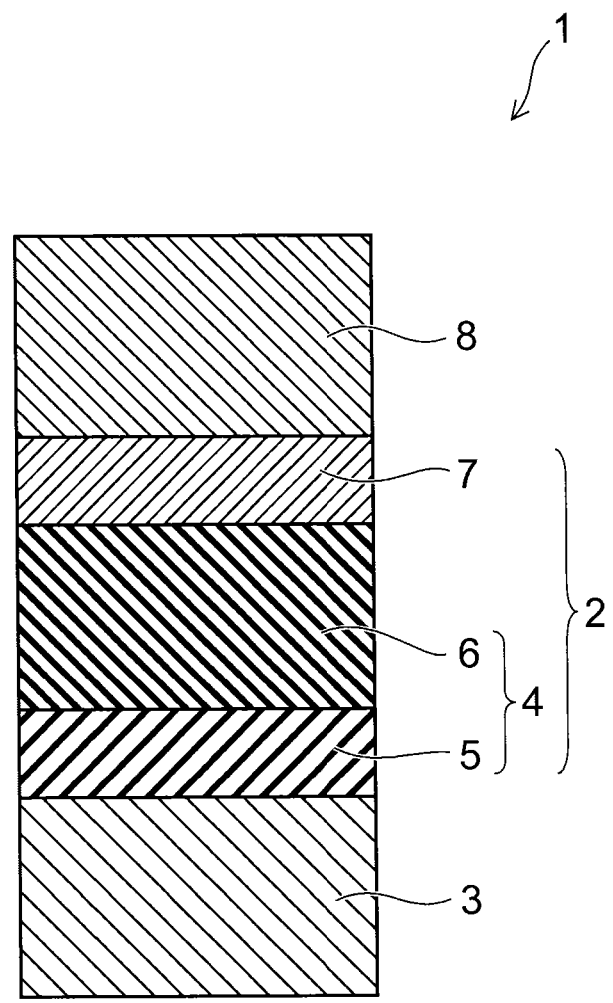
FIG. 1 is a schematic cross-sectional view for illustrating a nonvolatile memory device according to a first embodiment.

In general, according to one embodiment, a nonvolatile memory device includes a first electrode, a second electrode, and a memory cell provided between the first electrode and the second electrode. The memory cell includes a retention unit, a resistance change unit, and an ion supply unit. The retention unit is provided on the first electrode and has an electron trap. The resistance change unit is provided on the retention unit. The ion supply unit is provided between the resistance change unit and the second electrode and includes a metal element.

Various embodiments will be illustrated hereinafter with reference to the accompanying drawings.

In the drawings, similar components are marked with the same reference numerals, and a detailed description is omitted as appropriate.

First Embodiment

FIG. 1 is a schematic cross-sectional view for illustrating a nonvolatile memory device according to a first embodiment.

In FIG. 1, the portion of a memory cell is mainly shown, and commonly known word lines, bit lines, protection films, interlayer insulating films, contacts, peripheral circuit units, etc. provided in a nonvolatile memory device 1 are omitted.

As shown in FIG. 1, the nonvolatile memory device 1 includes a first electrode 3, a memory cell 2, and a second electrode 8.

The first electrode 3 is formed of a conductive material.

The conductive material is not particularly limited; for example, tungsten (W), tungsten nitride (WN), tungsten carbide (WC), titanium (Ti), titanium nitride (TiN), copper (Cu), aluminum (Al), molybdenum (Mo), tantalum (Ta), silicide, silicon doped with a dopant element, and the like may be illustrated.

The second electrode 8 is provided on an ion supply unit 7 described later.

The second electrode 8 is formed of a conductive material. The material of the second electrode 8 may be similar to the material of the first electrode 3.

The first electrode 3 and the second electrode 8 are connected to a not-shown word line and a not-shown bit line.

It is also possible to use the first electrode 3 and the second electrode 8 as a word line and a bit line.

In the memory cell 2 provided between the first electrode 3 and the second electrode 8, a memory unit 4 and an ion supply unit 7 are provided.

The memory unit 4 includes a retention unit 5 and a resistance change unit 6.

The retention unit 5 is provided on the first electrode 3.

The retention unit 5 traps electrons moving from a conduction path 7a described later toward the first electrode 3 side. Alternatively, the retention unit 5 traps electrons from the first electrode 3 side.

Thus, the retention unit 5 has electron traps that trap electrons.

For example, the retention unit 5 may include a metal oxide having electron traps.

For example, the retention unit 5 may be formed of a metal oxide or the like having a defect caused by oxygen deficiency or the like.

In this case, the metal oxide may be hafnium oxide ($HfO_x$), silicon oxynitride ($SiO_xN_y$), aluminum oxide ($Al_xO_y$), lanthanum oxide ($La_xO_y$), tantalum oxide ($Ta_xO_y$), strontium oxide ($Sr_xO_y$), yttrium oxide ($Y_xO_y$), barium oxide ($Ba_xO_y$), zinc oxide ($Zn_xO_y$), or the like.

The retention unit 5 may be formed of one layer, or may have a configuration in which a plurality of layers is stacked.

For example, the retention unit 5 may have a configuration in which a layer formed of silicon oxide ($SiO_x$) and a layer formed of any of the metal oxides described above are stacked.

In this case, the retention unit 5 may include a layer including silicon oxide ($SiO_x$) and a layer including at least one selected from the group consisting of hafnium oxide ($HfO_x$), silicon oxynitride ($SiO_xN_y$), aluminum oxide ($Al_xO_y$), lanthanum oxide ($La_xO_y$), tantalum oxide ($Ta_xO_y$), strontium oxide ($Sr_xO_y$), yttrium oxide ($Y_xO_y$), barium oxide ($Ba_xO_y$), and zinc oxide ($Zn_xO_y$).

By using the retention unit 5 in which a plurality of layers are stacked, electrons can be trapped in electron traps in each layer and electrons can be trapped also in electron traps generated at the interface between layers.

According to the findings obtained by the inventors, the electron trap density of the retention unit 5 is preferably set to $1\times10^{11}/cm^3$ or more.

By setting the electron trap density of the retention unit 5 to $1\times10^{11}/cm^3$ or more, ionization of the metal forming the conduction path 7a described later can be sufficiently prevented.

Consequently, since a prescribed resistance state can be retained for a long time, data retention properties can be improved.

The electron trap density of the retention unit 5 is preferably set to $1\times10^{13}/cm^3$ or less.

If the electron trap density of the retention unit 5 exceeds $1\times10^{13}/cm^3$, a leak current may be likely to occur.

The dielectric constant of the retention unit 5 is preferably set higher than the dielectric constant of the resistance change unit 6. Thereby, a high voltage can be applied and therefore the formation of the conduction path 7a described later becomes easy.

The retention unit 5 may include, for example, at least one selected from the group consisting of a metal oxide having a higher dielectric constant than silicon oxide, a metal nitride having a higher dielectric constant than silicon oxide, and a mixture of a metal oxide and a metal nitride having a higher dielectric constant than silicon oxide. Alternatively, the retention unit 5 may have a configuration in which a plurality of layers made of these materials is stacked.

In the case where a plurality of layers are stacked, the plurality of layers may each include at least one of mutually different ones selected from the group consisting of a metal oxide having a higher dielectric constant than silicon oxide, a metal nitride having a higher dielectric constant than silicon oxide, and a mixture of a metal oxide and a metal nitride having a higher dielectric constant than silicon oxide.

Details of the operation and effect of the retention unit 5 are described later.

The resistance change unit 6 is provided on the retention unit 5.

The resistance change unit 6 is formed of a material having a high resistance and not interfering with the diffusion of ions from the ion supply unit 7.

For example, the resistance change unit 6 may be formed of amorphous silicon, silicon oxide, or the like.

The ion supply unit 7 is provided between the resistance change unit 6 and the second electrode 8.

The ion supply unit 7 diffuses metal ions into the resistance change unit 6, and precipitates a metal from the diffused metal ions to form a conduction path in the resistance change unit 6.

The ion supply unit 7 may be formed of, for example, a metal such as silver (Ag), copper (Cu), cobalt (Co), nickel (Ni), aluminum (Al), or titanium (Ti), an alloy of them, or the like.

Next, the operation of the nonvolatile memory device 1 and the operation and effect of the retention unit 5 are illustrated.

Figure 2A:
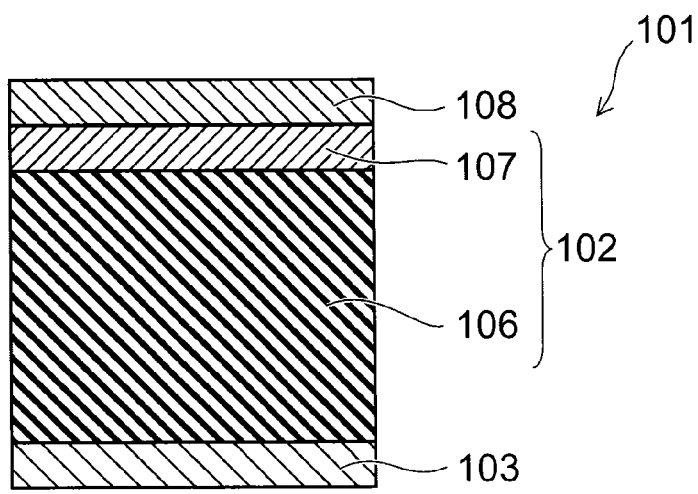
FIGS. 2A to 2C are schematic cross-sectional views for illustrating the operation of a nonvolatile memory device 101 according to a comparative example.
Figure 2B:
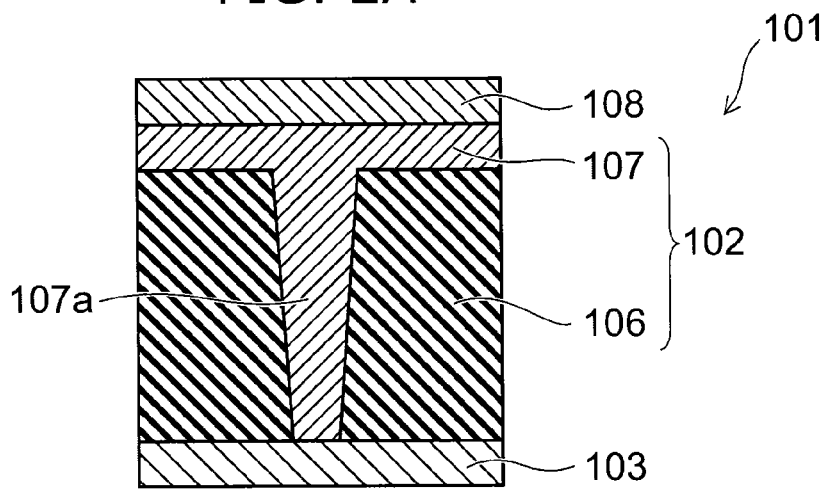
Figure 2C:
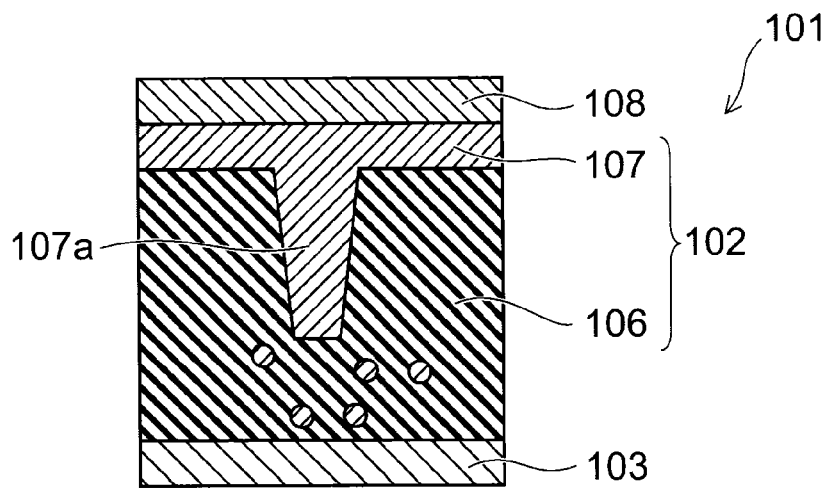

FIGS. 2A to 2C are schematic cross-sectional views for illustrating the operation of a nonvolatile memory device 101 according to a comparative example.

In FIGS. 2A to 2C, the operation of a memory cell 102 is mainly illustrated.

As shown in FIG. 2A, the nonvolatile memory device 101 according to the comparative example includes a first electrode 103, a memory cell 102, and a second electrode 108.

The memory cell 102 includes a resistance change unit 106 and an ion supply unit 107.

Here, the first electrode 103, the ion supply unit 107, and the second electrode 108 may be similar to the first electrode 3, the ion supply unit 7, and the second electrode 8 described above, respectively.

Furthermore, the resistance change unit 106, which is a memory unit in the nonvolatile memory device 101, may be similar to the resistance change unit 6 described above.

That is, the nonvolatile memory device 101 according to the comparative example is the case where the retention unit 5 is not provided.

In the nonvolatile memory device 101 thus configured, a voltage is applied such that the first electrode 103 becomes a negative pole and the second electrode 108 becomes a positive pole.

Thereby, as shown in FIG. 2B, the metal forming the ion supply unit 107 (e.g. silver (Ag)) changes to positive ions, the ions move toward the negative pole (the first electrode 103) side due to the electric field, and the ionized metal precipitates. Thus, a conduction path 107a is formed in the resistance change unit 106.

When the conduction path 107a is formed, a situation is created where the resistance between the first electrode 103 and the second electrode 108 is low.

Further, in the state where the conduction path 107a is formed, a voltage is applied such that the first electrode 103 becomes a positive pole and the second electrode 108 becomes a negative pole.

Thereby, the metal forming the conduction path 107a is ionized and the conduction path 107a becomes short or disappears.

When the conduction path 107a becomes short or disappears, the situation becomes one where the resistance between the first electrode 103 and the second electrode 108 is high.

Thus, at least two resistance states can be created, and data can therefore be stored.

Here, in the state where the conduction path 107a is formed, the conduction path 107a may become short even when no voltage is applied between the first electrode 103 and the second electrode 108.

For example, electrons may move from a portion where the conduction path 107a and the first electrode 103 are in contact or from the conduction path 107a near the portion toward the first electrode 103 side, and the metal forming the conduction path 107a may be ionized.

For example, in the case where the metal forming the conduction path 107a is silver (Ag), Ag becomes a Ag ion ($Ag^+$)+an electron ($e^-$); the electron ($e^-$) moves toward the first electrode 103 side and the silver (Ag) changes to the Ag ion.

When such a reaction occurs continuously, as shown in FIG. 2C, the conduction path 107a and the first electrode 103 are separated, and a low resistance state cannot be retained.

That is, a prescribed resistance state cannot be retained for a long time, and data retention properties may be degraded.

In contrast, the nonvolatile memory device 1 according to the embodiment includes the retention unit 5, and can therefore retain a prescribed resistance state for a long time.

Next, the operation of the nonvolatile memory device 1 according to the embodiment and the operation and effect of the retention unit 5 are illustrated.

Figure 3:
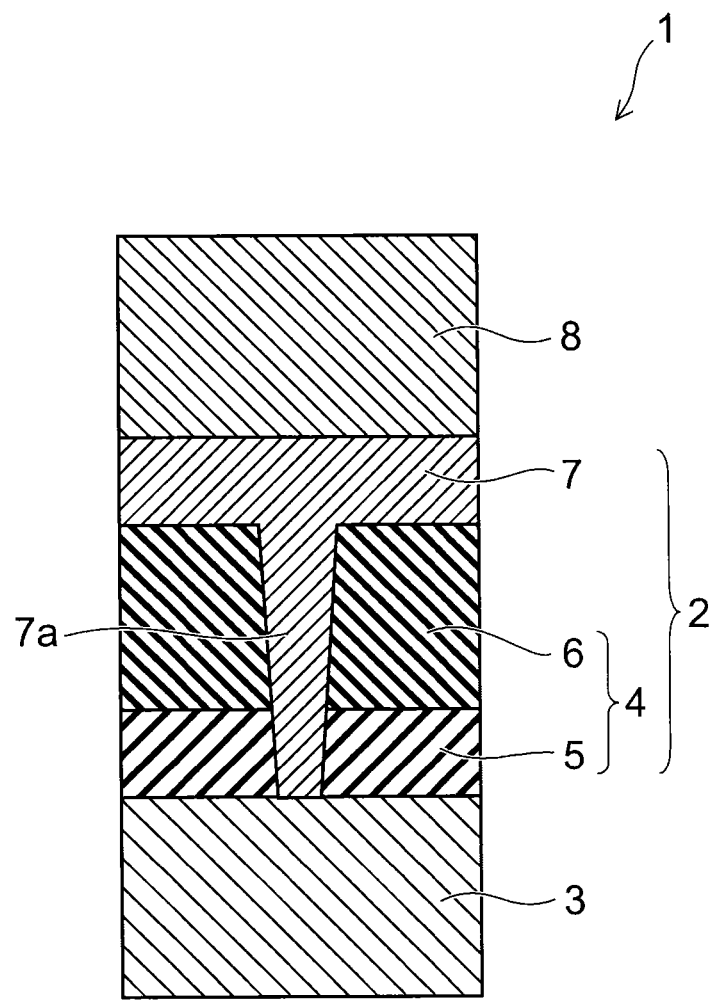
FIG. 3 is a schematic cross-sectional view for illustrating the operation of the nonvolatile memory device 1.

FIG. 3 is a schematic cross-sectional view for illustrating the operation of the nonvolatile memory device 1.

In the nonvolatile memory device 1, a voltage is applied such that the first electrode 3 becomes a negative pole and the second electrode 8 becomes a positive pole.

Thereby, the metal forming the ion supply unit 7 (e.g. silver (Ag)) is ionized, and diffuses in the resistance change unit 6 toward the first electrode 3 side due to the electric field. The metal ions diffused in the resistance change unit 6 receive electrons near the first electrode 3, and precipitate as a metal again.

By the ionization, diffusion, and precipitation of the metal forming the ion supply unit 7 being repeated, a conduction path 7a is formed in the resistance change unit 6 as shown in FIG. 3.

When the conduction path 7a is formed, a situation is created where the resistance between the first electrode 3 and the second electrode 8 is low.

Further, in the state where the conduction path 7a is formed, a voltage is applied such that the first electrode 3 becomes a positive pole and the second electrode 8 becomes a negative pole.

Thereby, the metal forming the conduction path 7a is ionized and the conduction path 7a becomes short or furthermore disappears.

When the conduction path 7a becomes short or disappears, the situation becomes one where the resistance between the first electrode 3 and the second electrode 8 is high.

Thus, at least two resistance states can be created, and data can therefore be stored.

Here, when electrons move from a portion where the conduction path 7a and the first electrode 3 are in contact or from the conduction path 7a near the portion toward the first electrode 3 side, the metal forming the conduction path 7a is ionized to separate the conduction path 7a and the first electrode 3. Consequently, a prescribed resistance state cannot be retained for a long time, and data retention properties may be degraded.

In view of this, in the nonvolatile memory device 1 according to the embodiment, the retention unit 5 having electron traps that trap electrons is provided on the first electrode 3.

When electrons that have moved from the conduction path 7a are trapped in electron traps included in the retention unit 5, an equilibrium state is formed between the electrons trapped in the electron traps and the electrons moving from the conduction path 7a.

In the case of the retention unit 5 in which a plurality of layers are stacked, electrons are trapped in electron traps in each layer and electrons are trapped also at the interface between layers.

Therefore, the movement of electrons from the conduction path 7a toward the first electrode 3 side is suppressed, and the metal forming the conduction path 7a can thus be prevented from being ionized.

Consequently, since a prescribed resistance state can be retained for a long time, data retention properties can be improved.

Second Embodiment

Next, a method for manufacturing the nonvolatile memory device 1 is illustrated.

FIGS. 4A to 4E are schematic process cross-sectional views for illustrating a method for manufacturing the nonvolatile memory device 1.

FIGS. 4A to 4E illustrate the case of manufacturing a cross-point nonvolatile memory device 1.

Since known art can be applied to the formation of peripheral circuit units etc. provided in the nonvolatile memory device 1, the illustration of them is omitted and herein the formation of the memory cell 2 is mainly illustrated.

Arrows X, Y, and Z in FIGS. 4A to 4E indicate three orthogonal directions; for example, X and Y indicate directions parallel to the major surface of a substrate and Z indicates the direction perpendicular to the major surface of the substrate.

Figure 4A:
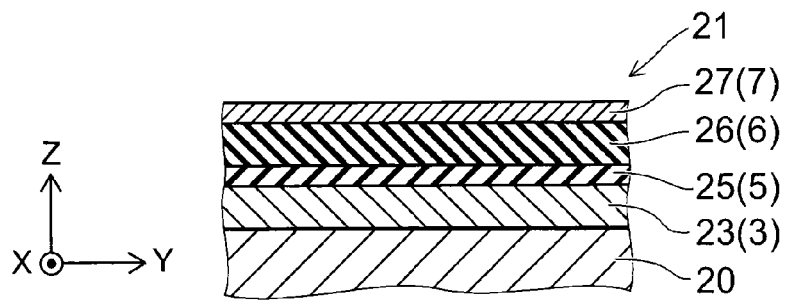
FIGS. 4A to 4E are schematic process cross-sectional views for illustrating a method for manufacturing the nonvolatile memory device 1.

First, as shown in FIG. 4A, a stacked body 21 before processed into the configuration of the memory cell 2 is formed.

That is, on the major surface of a substrate 20 such as a wafer, a film 23 that forms the first electrode 3, a film 25 that forms the retention unit 5, a film 26 that forms the resistance change unit 6, and a film 27 that forms the ion supply unit 7 are stacked in this order to form the stacked body 21. Heat treatment etc. may be performed in the formation of the layers as necessary.

The materials of the layers may be similar to those described above.

The formation of the film 23 that forms the first electrode 3, the film 26 that forms the resistance change unit 6, and the film 27 that forms the ion supply unit 7 may be performed using, for example, a known film-formation method such as the sputtering method or the chemical vapor deposition (CVD) method.

As described above, the retention unit 5 is configured to have electron traps that trap electrons.

Hence, the film 25 that forms the retention unit 5 is formed of a material in which electron traps are formed.

The material in which electron traps are formed may be similar to those described above.

For example, in the process of forming the film 25 that forms the retention unit 5, a film 25 including at least one selected from the group consisting of hafnium oxide ($HfO_x$), silicon oxynitride ($SiO_xN_y$), aluminum oxide ($Al_xO_y$), lanthanum oxide ($La_xO_y$), tantalum oxide ($Ta_xO_y$), strontium oxide ($Sr_xO_y$), yttrium oxide ($Y_xO_y$), barium oxide ($Ba_xO_y$), and zinc oxide ($Zn_xO_y$) may be formed.

The formation of the film 25 that forms the retention unit 5 may be performed using, for example, the sputtering method, the low pressure chemical vapor deposition (LPCVD) method, the atomic layer deposition (ALD) method, or the like.

After the film-formation of the film 25 that forms the retention unit 5, for example, ion implantation may be performed to make a defect caused by oxygen deficiency or the like to form electron traps.

In the case where ion implantation is performed after the film-formation of the film 25 that forms the retention unit 5, the density of electron traps included in the retention unit 5 can be controlled.

When ion implantation is performed, for example, the density of electron traps can be controlled to set the electron trap density of the retention unit 5 to $1\times10^{11}/cm^3$ or more.

Furthermore, when ion implantation is performed, for example, the density of electron traps can be controlled to set the electron trap density of the retention unit 5 to $1\times10^{13}/cm^3$ or less.

In the ion implantation, for example, oxygen ions may be implanted.

Figure 4B:
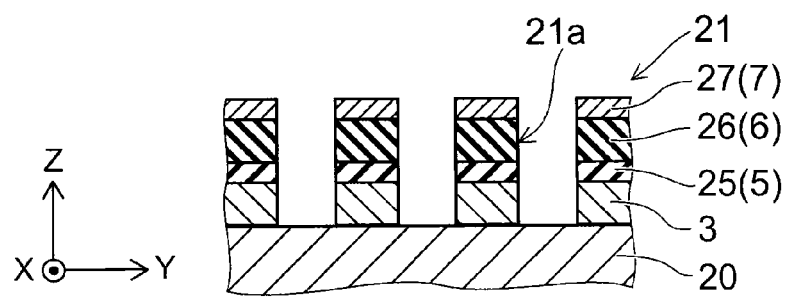

Next, as shown in FIG. 4B, trenches 21a are formed in the stacked body 21.

The formation of the trench 21a may be performed using, for example, the PEP (photo-engraving process) and the RIE (reactive ion etching) method or the like.

FIG. 4B illustrates a cross section of the stacked body 21 taken substantially perpendicular to the X direction.

Thereby, the stacked body 21 is separated by the trench 21a in the Y direction. Furthermore, the first electrode 3 in a stripe shape extending in the X direction is formed on the substrate 20.

The etching conditions in the etching processing of the layers are appropriately selected in accordance with the materials of the layers etc.

For example, the gas for etching, electric discharge conditions, etc. are appropriately altered in accordance with the materials of the layers etc.

Figure 4C:
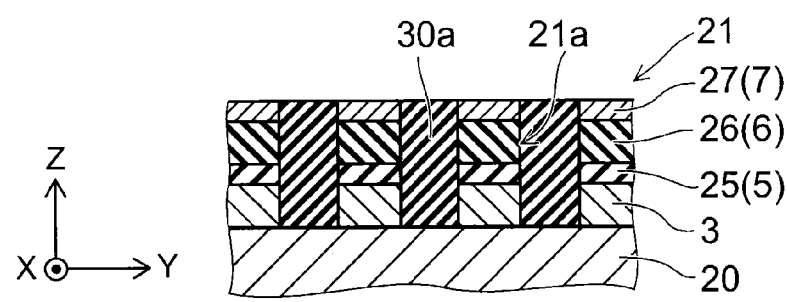

Next, as shown in FIG. 4C, an insulator is buried in the trench 21a to form an element isolation unit 30a.

The formation of the element isolation unit 30a may be performed using an application method such as the spin coating method. For example, a perhydropolysilazane (PHPS) solution, which is a polysilazane-based material, may be applied using the spin coating method to form an element isolation unit 30a including silicon oxide ($SiO_2$) as a main component in the trench 21a.

For the formation of the element isolation unit 30a, also the physical vapor deposition (PVD) method, the chemical vapor deposition method, or the like may be used.

After that, the CMP (chemical mechanical polishing) method or the like is used to planarize the surface of the stacked body 21 in which the element isolation unit 30a is formed.

Figure 4D:
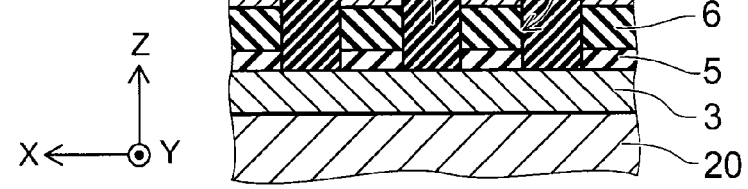

Next, as shown in FIG. 4D, trenches 21b are formed in the stacked body 21.

The formation of the trench 21b may be similar to the formation of the trench 21a described above. FIG. 4D illustrates a cross section of the stacked body 21 taken substantially perpendicular to the Y direction.

The stacked body 21 is separated by the trench 21a described above in the Y direction and is separated by the trench 21b in the X direction.

After that, an insulator is buried in the trench 21b to form an element isolation unit 30b.

The formation of the element isolation unit 30b may be similar to the formation of the element isolation unit 30a described above.

The CMP method or the like is used to planarize the surface of the stacked body 21 in which the element isolation unit 30b is formed.

Figure 4E:
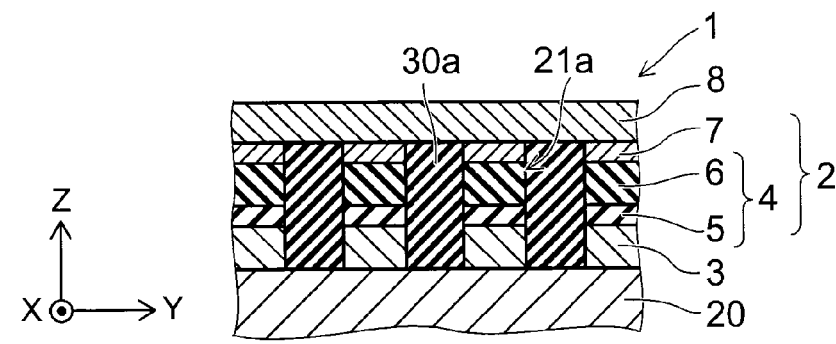

Next, as shown in FIG. 4E, a film that forms the second electrode 8 is formed on the stacked body 21, and the second electrode 8 in a stripe shape extending in the Y direction is formed on the stacked body 21 using the PEP and the RIE (reactive ion etching) method or the like.

In this way, the memory cell 2 can be formed at the intersection of the first electrode 3 in a stripe shape extending in the X direction and the second electrode 8 in a stripe shape extending in the Y direction.

In this case, one of the first electrode 3 in a stripe shape and the second electrode 8 in a stripe shape may be used as a word line, and the other may be used as a bit line.

Thus, a cross-point nonvolatile memory device 1 can be manufactured.

What are illustrated in the first embodiment and the second embodiment are cases where one layer of memory cells 2 is provided, but a plurality of memory cells 2 may be provided to be stacked.

In the case where memory cells 2 are stacked, an insulating layer may be provided between vertically adjacent memory cells 2.

The first electrode 3 or the second electrode 8 may be shared between vertically adjacent memory cells 2.

Figure 5:
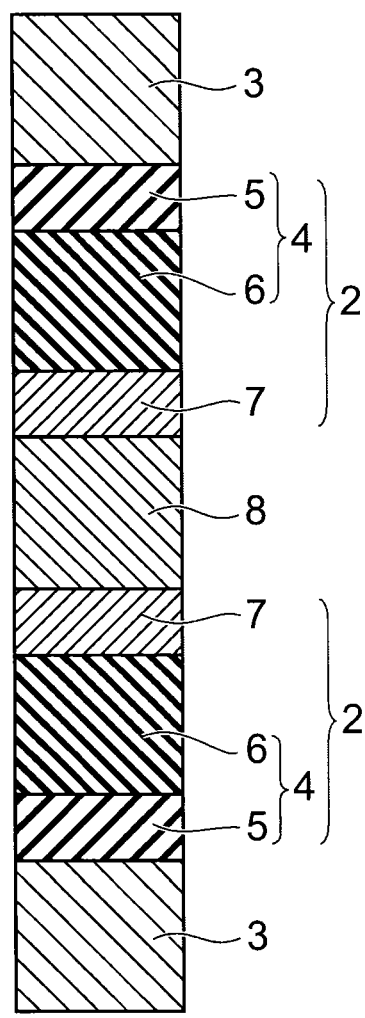
FIG. 5 is a schematic cross-sectional view for illustrating an example of memory cells 2 stacked.

FIG. 5 is a schematic cross-sectional view for illustrating an example of memory cells 2 stacked.

As shown in FIG. 5, when the second electrode 8 is shared between vertically adjacent memory cells 2, the downsizing of the nonvolatile memory device, the simplification of manufacturing processes, etc. can be achieved.

It is also possible for the first electrode 3 to be shared between vertically adjacent memory cells 2.

The embodiments illustrated above can provide a nonvolatile memory device than can improve data retention properties and a method for manufacturing the same.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. Moreover, above-mentioned embodiments can be combined mutually and can be carried out.

What is claimed is:

1. A nonvolatile memory device comprising a first electrode, a second electrode, and a memory cell provided between the first electrode and the second electrode, the memory cell comprising:
    a retention unit provided on the first electrode and comprising an electron trap, and the electron trap density of the retention unit is $1 \times 10^{11}/cm^3$ or more;
    a resistance change unit provided on the retention unit, the resistance change unit comprising at least one of amorphous silicon and silicon oxide; and
    an ion supply unit provided between the resistance change unit and the second electrode and comprising a metal element,
    wherein a dielectric constant of the retention unit is higher than a dielectric constant of the resistance change unit.

2. The device according to claim 1, wherein the retention unit comprises a metal oxide having the electron trap.

3. The device according to claim 1, wherein the retention unit comprises at least one selected from the group consisting of hafnium oxide ($HfO_x$), silicon oxynitride ($SiO_xN_y$), aluminum oxide ($Al_xO_y$), lanthanum oxide ($La_xO_y$), tantalum oxide ($Ta_xO_y$), strontium oxide ($Sr_xO_y$), yttrium oxide ($Y_xO_y$), barium oxide ($Ba_xO_y$), and zinc oxide ($Zn_xO_y$).

4. The device according to claim 1, wherein an electron trap density of the retention unit is $1 \times 10^{13}/cm^3$ or less.

5. The device according to claim 1, wherein the retention unit comprises a plurality of layers stacked.

6. The device according to claim 1, wherein the retention unit comprises:
    a layer comprising silicon oxide ($SiO_x$); and
    a layer comprising at least one selected from the group consisting of hafnium oxide ($HfO_x$), silicon oxynitride ($SiO_xN_y$), aluminum oxide ($Al_xO_y$), lanthanum oxide ($La_xO_y$), tantalum oxide ($Ta_xO_y$), strontium oxide ($Sr_xO_y$), yttrium oxide ($Y_xO_y$), barium oxide ($Ba_xO_y$), and zinc oxide ($Zn_xO_y$).

7. The device according to claim 1, wherein the retention unit comprises at least one selected from the group consisting of a metal oxide having a higher dielectric constant than silicon oxide, a metal nitride having a higher dielectric constant than silicon oxide, and a mixture of a metal oxide and a metal nitride having a higher dielectric constant than silicon oxide.

8. The device according to claim 1, wherein the retention unit comprises a plurality of layers stacked and the plurality of layers each comprise at least one of mutually different ones selected from the group consisting of a metal oxide having a higher dielectric constant than silicon oxide, a metal nitride having a higher dielectric constant than silicon oxide, and a mixture of a metal oxide and a metal nitride having a higher dielectric constant than silicon oxide.

9. The device according to claim 1, wherein the ion supply unit comprises at least one selected from the group consisting of silver, copper, cobalt, nickel, aluminum, and titanium.

10. The device according to claim 1, wherein the resistance change unit comprises silicon oxide.

11. The device according to claim 1, wherein the ion supply unit forms a conduction path in the resistance change unit and the retention unit traps an electron moving from the conduction path toward the first electrode side.

12. The device according to claim 11, wherein the retention unit comprises a plurality of layers stacked and the retention unit traps an electron moving from the conduction path toward the first electrode side in the plurality of layers and at an interface between adjacent ones of the plurality of layers.

13. The device according to claim 1, wherein the memory cell is provided to be stacked in plural.

14. The device according to claim 1, wherein the resistance change unit comprises amorphous silicon.

15. The device according to claim 1, wherein the resistance change unit comprises amorphous silicon and silicon oxide.

16. A method for manufacturing the nonvolatile memory device according to claim 1, said method comprising:
forming a film that forms the retention unit on a film that forms the first electrode;
forming a film that forms the resistance change unit on the film that forms the retention unit; and
forming a film comprising at least one of amorphous silicon and silicon oxide that forms the ion supply unit on the film that forms the resistance change unit,
ion implantation being performed to form an electron trap in the forming a film that forms the retention unit, the electron trap density of the retention unit is $1\times10^{11}/cm^3$ or more, and a dielectric constant of the retention unit being higher than a dielectric constant of the resistance charge unit.

17. The method according to claim 16, wherein
a density of the electron trap is controlled in performing the ion implantation.

18. The method according to claim 16, wherein
a density of the electron trap is controlled in performing the ion implantation and
an electron trap density of the retention unit is made $1\times10^{13}/cm^3$ or less.

19. The method according to claim 16, wherein an oxygen ion is implanted in performing the ion implantation.

20. The method according to claim 16, wherein in the forming a film that forms the retention unit, the film comprising at least one selected from the group consisting of hafnium oxide ($HfO_x$), silicon oxynitride ($SiO_xN_y$), aluminum oxide ($Al_xO_y$), lanthanum oxide ($La_xO_y$), tantalum oxide ($Ta_xO_y$), strontium oxide ($Sr_xO_y$), yttrium oxide ($Y_xO_y$), barium oxide ($Ba_xO_y$), and zinc oxide ($Zn_xO_y$) is formed.

* * * * *